United States Patent
Ito

(10) Patent No.: US 6,454,202 B2
(45) Date of Patent: Sep. 24, 2002

(54) CABLE STORAGE APPARATUS AND CABLE PROCESSING METHOD

(75) Inventor: Takeharu Ito, Tokyo (JP)

(73) Assignee: NEC Corporation, Toyo (JP)

( * ) Notice: Subject to any disclaimer, the term of this patent is extended or adjusted under 35 U.S.C. 154(b) by 0 days.

(21) Appl. No.: 09/788,509

(22) Filed: Feb. 21, 2001

(30) Foreign Application Priority Data

Feb. 21, 2000 (JP) ........................................ 2000-042561

(51) Int. Cl.⁷ .......................... B65H 75/30; B65H 75/38
(52) U.S. Cl. .............................. 242/388.1; 242/388.7; 242/390.9; 242/396.5; 242/402; 191/12.2 A
(58) Field of Search ................................ 242/388, 388.1, 242/388.2, 388.3, 388.5, 388.6, 388.7, 390.8, 390.9, 402, 396.5, 413, 413.4, 413.5; 191/12.2 A, 12.4

(56) References Cited

U.S. PATENT DOCUMENTS

| | | | | |
|---|---|---|---|---|
| 2,596,318 A | * | 5/1952 | Willi et al. ................. | 254/271 |
| 4,565,334 A | * | 1/1986 | Ruhl ........................ | 242/413.4 |
| 5,346,159 A | * | 9/1994 | Deket ....................... | 242/388.1 |
| 5,779,175 A | * | 7/1998 | Shirabase ................ | 242/388.1 |
| 6,149,096 A | * | 11/2000 | Hartley .................... | 242/390.9 |

FOREIGN PATENT DOCUMENTS

JP  5-152770  6/1993

\* cited by examiner

*Primary Examiner*—John M. Jillions
(74) *Attorney, Agent, or Firm*—Sughrue Mion, PLLC

(57) ABSTRACT

A reel which is driven by a motor is disposed in a casing. First and second restraining mechanisms for restraining movement of a cable are located at first and second openings formed in the casing for insertion of the cable. The cable extends between said first and second openings and is wound around the reel. One end of the cable is secured by the first restraining mechanism, and the motor is activated to rotate the reel, thereby winding the cable around the reel. When a pressure sensor located on the surface of the reel detects that the pressure between the cable and the reel reaches a given value, the motor is stopped. The other end of the cable is secured by the second restraining mechanism.

9 Claims, 4 Drawing Sheets

CABLE STORAGE APPARATUS AND CABLE PROCESSING METHOD

BACKGROUND OF THE INVENTION

1. Field of the Invention

The present invention relates to a cable storage (retaining) apparatus and a cable processing method, which retain the surplus portions (surplus lengths) of cables at the time a plurality of electronic devices are connected by the cables.

2. Description of the Related Art

A plurality of electronic devices are normally connected by cables. In some cases, however, it is difficult to identify which connectors are connected by which cable. Without processing the surplus portion (surplus length) of a cable (surplus length processing), the cable hangs down loosely. further, the weight of the hung cable itself applies stress on the connectors or the like. As cables are likely to be laid disorderly, the layout looks poor and the working environment where electronic devices are to be handled is apt to become poor.

Unexamined Japanese Patent Application KOKAI Publication No. H5-152770 discloses a cable apparatus which can overcome those problems. The disclosed cable apparatus can retain a part (surplus portion) of a cable in the casing. This cable apparatus however requires that a user should determine the length of the surplus portion of a cable and retain the surplus portion in the casing himself or herself. This work is troublesome and inconvenient.

SUMMARY OF THE INVENTION

Accordingly, it is an object of the present invention to provide a cable storage apparatus and a cable processing method which can automatically adjust the length of the surplus portion of a cable.

It is another object of the invention to provide a cable storage apparatus and a cable processing method which are easy to use.

To achieve the above objects, according to the first aspect of the invention, there is provided a cable storage apparatus comprising:

a casing;

a cable having both ends respectively to be connected to connectors;

a reel which is disposed in the casing and around which the cable is to be wound;

a winding mechanism which winds the cable by rotating the reel;

a pressure sensor which measures a pressure on the cable; and a control circuit which controls winding of the cable by the winding mechanism when the pressure measured by the pressure sensor becomes equal to or higher than a predetermined value.

The pressure sensor is located on, for example, a cable winding surface of the reel and measures a pressure of the cable acting on the cable winding surface.

For example, a first opening and a second opening are formed in the casing and a first and second restraining mechanisms which restrains movement of the cable are arranged in the casing near the first and second openings.

A cable through hole may be formed in the reel, penetrating a circular side surface of the reel perpendicularly to a rotary shaft of the reel. In this case, the winding mechanism has a motor whose rotary shaft is coaxial to the rotary shaft of the reel, and the cable is led through the first opening of the casing, is put through the cable through hole of the reel, is wound on the circular side surface of the reel and is then led out from the second opening of the casing.

With the cable secured by the first restraining mechanism and not by the second restraining mechanism, for example, the reel is rotated by the motor to wind the cable around the reel, and when the pressure sensor detects a predetermined pressure, the motor is stopped and the cable is secured by the second restraining mechanism.

The cable storage apparatus may further comprise a sensor which detects that tension of the cable becomes equal to or lower than a predetermined value, and an alarm circuit which generates an alarm in response to detection of the sensor.

To achieve the above objects, according to the second aspect of the invention, there is provided a cable storage apparatus comprising:

a casing having two openings formed for insertion of a cable;

a reel which is disposed in the casing and around which the cable extending between the two openings is to be wound;

a winding mechanism which winds the cable by rotating the reel;

a pressure sensor which measures a pressure on the cable; and a control circuit which controls winding of the cable by the winding mechanism when the pressure measured by the pressure sensor becomes equal to or higher than a predetermined value.

To achieve the above objects, according to the third aspect of the invention, there is provided a cable processing method comprising:

securing a cable, led into a casing through a first opening formed in the casing, put through a hole formed perpendicular to a rotary shaft of a reel, wound on a side surface of the reel and led out from a second opening formed in the casing, at one of the first and second openings;

winding the cable around the reel by rotating the reel; and detecting force applied to the cable, and stopping rotating the reel and securing the cable at the second opening when the force applied to the cable reaches a predetermined value.

Tension on the cable may be detected so that an alarm is generated when the tension becomes equal to or smaller than a predetermined value.

DETAILED DESCRIPTION OF THE PREFERRED EMBODIMENTS

The present invention will now be described with reference to the accompanying drawings.

Figure 1:
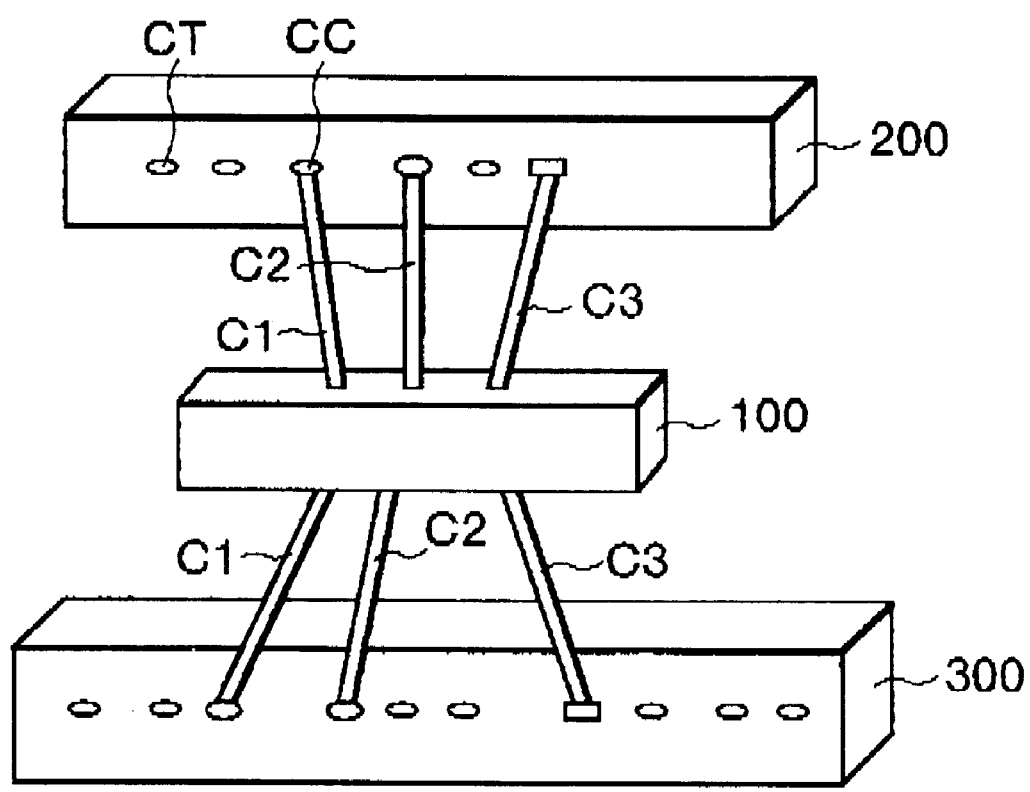
FIG. 1 is a perspective view illustrating how a cable storage apparatus embodying the present invention is used.

FIG. 1 illustrates how a cable storage apparatus 100 according to the first embodiment of the invention is used.

Electronic devices 200 and 300, such as a computer and studio equipment, are to be connected together by cables C1, C2 and C3.

The cables C1–C3 are, for example, multi-core cables with connectors CC attached to both sides of each cable. Each connector CC is connected to a connector CT located on the electronic device 200 or 300. The cable storage (retaining) apparatus 100 automatically takes up the surplus portions (loose portions) of the cables C1, C2 and C3 so that the electronic devices 200 and 300 are connected together by the cables C1–C3 which are hardly loose.

Figure 2:
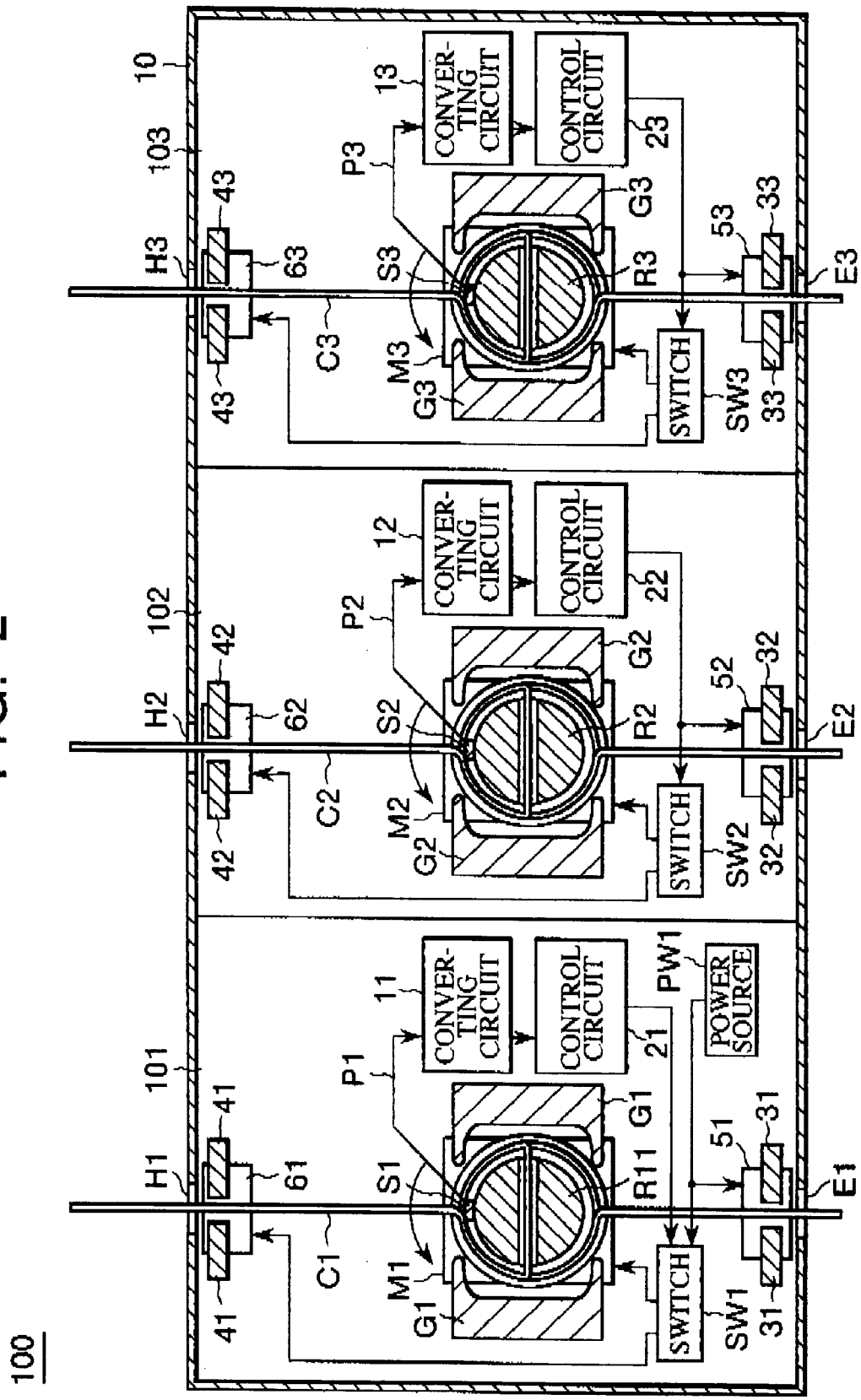
FIG. 2 is a structural diagram of a cable storage apparatus according to a first embodiment of the invention.

FIG. 2 is a diagram showing the structure of the cable storage apparatus 100. FIG. 2 shows the mechanical parts of the cable storage apparatus 100 in a cross-sectional view and an electric circuit in a block diagram.

As shown in FIG. 2, the cable storage apparatus 100 has storage sections 101 to 103 for taking up and retaining the cables C1–C3, respectively.

As the storage sections 101–103 have approximately the same structures, the structure and operation of the storage section 101 as a representative will be discussed below.

Symbols having the same alphabets with different numerals are used to denote those components of the storage sections 102 and 103 which are the same as the corresponding components of the storage section 101.

Figure 3:
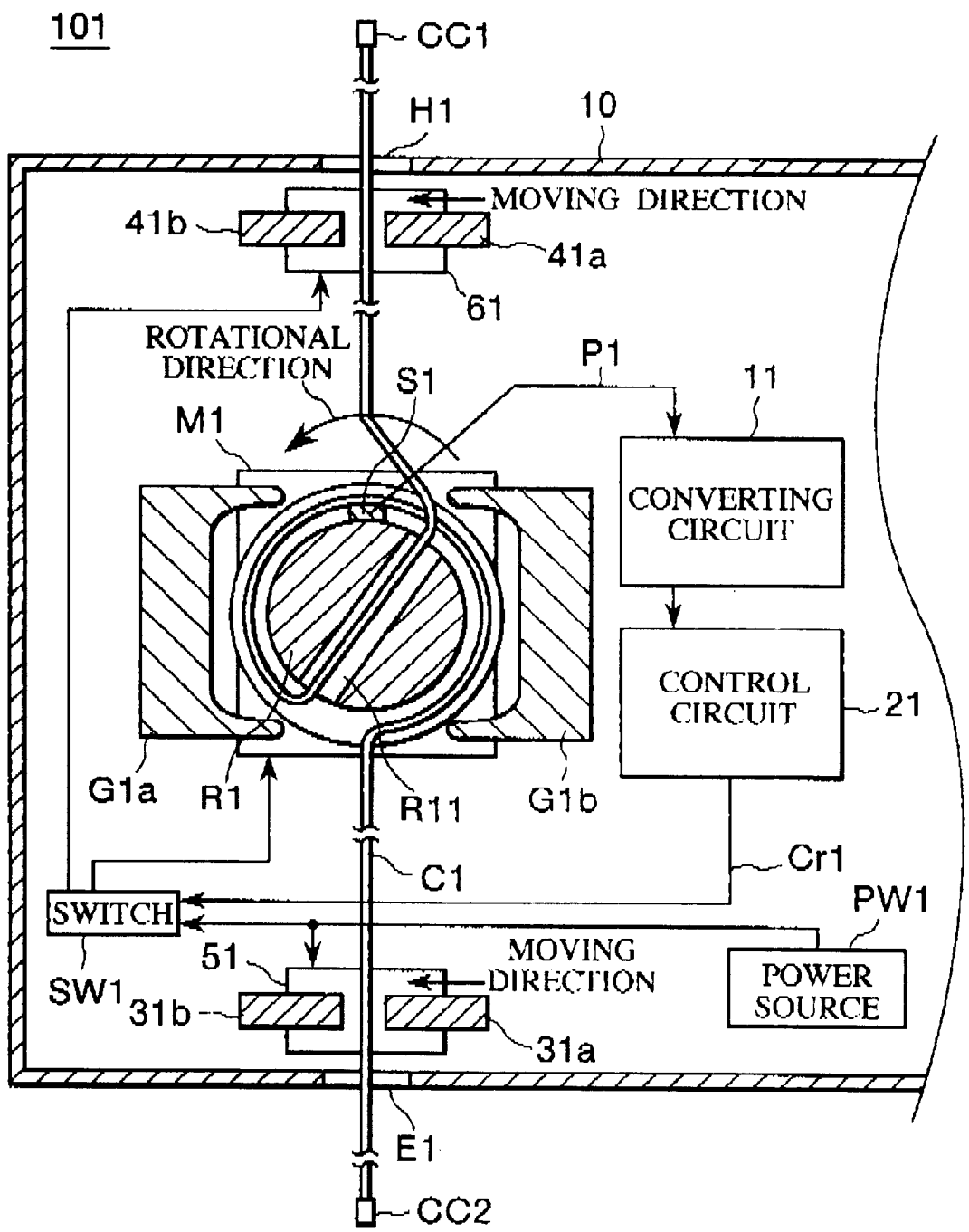
FIG. 3 is a diagram showing the detailed structure of a storage section of the cable storage apparatus shown in FIG. 2.

As shown in enlargement in FIG. 3, the storage section 101 comprises a casing 10, a converting circuit 11, a control circuit 21, a cable restraining mechanism 31 (31a and 31b), a cable restraining mechanism 41 (41a and 41b), constant torque motors 51 and 61, a motor M1, a reel R1 and a guide section G1 (G1a and G1b).

An opening E1 for insertion of one end of the cable C1 is formed in one side of the casing 10, and an opening H1 for insertion of the other end of the cable C1 is formed in the opposite side of the casing 10 to the former side.

The cable restraining mechanism 31 is located in the casing 10 near the opening E1. The cable restraining mechanism 31 comprises movable pieces 31a and 31b that are driven by the constant torque motor 51.

The cable restraining mechanism 41 is located in the casing 10 near the opening E1. The cable restraining mechanism 41 comprises movable pieces 41a and 41b that are driven by the constant torque motor 61.

The reel R1 has a cylindrical or columnar outer shape with frames on upper and lower end faces as seen above the sheet of FIG. 3, and is formed of metal or plastics. A through hole R11 for the cable C1 is formed in the circular side surface of the reel R1, penetrating perpendicularly to the rotary shaft of the reel R1. The inside diameter of the hole R1 is made large enough to freely pass the cable C1 (less friction with the cable C1).

The motor M1, which drives the reel R1, is so arranged that its rotary shaft is coaxial to the rotary shaft of the reel R1.

Further, a pressure sensor S1 is attached to the side surface of the reel R1. The motor M1 is provided with a fixed stand which has a ring-like conductor (ring conductor or slip ring). The output terminal of the pressure sensor S1 comes in a movable contact with the ring-like conductor which provides the output of the pressure sensor S1.

To make winding of the cable C1 around the circular side surface of the reel R1 easier, guides G1a and G1b have such walls as to be concentric to the reel R1 and serve to guide the cable C1.

The pressure sensor S1 outputs a signal P1 corresponding to the pressure applied to the sensor S1 or the pressure that is applied to the side surface of the reel R1 by the cable C1 wound around the reel R1. The converting circuit 11 converts the signal level of the signal P1 and sends the resultant signal to the control circuit 21.

The control circuit 21 compares the pressure that is indicated by the signal output from the converting circuit 11 with a preset reference pressure P1th. When the pressure detected by the pressure sensor S1 (the pressure of the wound cable C1 that presses the side surface of the reel R1) becomes equal to or higher than the reference pressure P1th, the control circuit 21 sends a switch SW1 with a control signal Cr1 for stopping the rotation of the motor M1.

A power source PW1 supplies power to the switch SW1 and the constant torque motor 51. Upon reception of the power from the power source PW1, the constant torque motor 51 drives the movable pieces 31a and 31b of the cable restraining mechanism 31 to hold and stop the cable C1. The switch SW1 starts supplying power to the motor M1.

Upon reception of the control signal Cr1, the switch SW1 stops supplying power to the motor M1 and starts supplying power to the constant torque motor 61. Then, the motor M1 that winds the cable C1 on the reel R1 stops rotating and the movable pieces 41a and 41b of the cable restraining mechanism 41 hold and stop the cable C1. Note that the casing 10 is covered with a detachable lid. The lid is placed on the top side of the casing 10 as seen from above the sheets of FIGS. 2 and 3.

The following will discuss how to use the cable storage apparatus 100 having the above-described structure.

The electronic devices 200 and 300 and the cable storage apparatus 100 are so laid that the cables C1–C3 can be laid in order as shown in FIG. 1. One end (connector CC1) of the cable C1 is connected to the connector CT of the electronic device 200. Next, the lid of the casing 10 (placed on the top side in FIG. 2) is opened and the other end of the cable C1 whose one end (connector CC1) is connected to the electronic device 200 is put through the opening H1 of the storage section 101. If there are cables C2 and C3 that should be connected to the electronic device 200, the cables C2 and C3 are retained in the other storage sections 102 and 103 in the same procedures as mentioned above.

The other end of the cable C1 led into the casing 10 through the opening H1 is put through the hole R11 of the reel R1 and is led out through the opening E1 of the casing 10. In this state, one end of the cable C1 is stretched to the adequate length and the cable C1 is wound on the circular side surface of the reel R1 by about one turn. Then, the reel R1 is manually turned clockwise a little so that the cable C1 makes approximately one turn (see FIG. 3). At this time, the guide section G1 serves to guide the cable C1 so that the cable C1 is easily taken up on the reel R1, and forms the winding of the cable C1 on the reel R1.

The other end (connector CC2) of the cable C1 that is led out through the opening E1 is connected to the connector CT of the electronic device 300. The length of the cable C1 whose other end (connector CC2) is connected to the electronic device 300, between the electronic device 300 and the opening E1, is manually adjusted to the adequate length. After the adjustment, the power source PW1 is turned on. As a result, the power from the power source PW1 is supplied to the constant torque motor 51. This activates the constant torque motor 51 to cause the cable restraining mechanism 31 (comprising the two pieces 31a and 31b) to hold the cable C1 with a constant torque. The constant torque of the cable restraining mechanism 31 prevents the cable C1 from being damaged and from moving inside and outside the casing 10.

Further, the power is supplied to the motor M1 via the switch SW1. The motor M1 rotates the reel R1 counterclockwise. The rotation of the reel R1 causes the cable C1 to be wound on the circular side surface of the reel R1 with the proper forming by the guide section G1.

At the beginning of the winding of the cable C1, the cable C1 is not taken up on the reel R1 even when the reel R1 rotates, and the cable C1 between the reel R1 and the cable restraining mechanism 31 and the cable C1 between the reel R1 and the cable restraining mechanism 41 become loose slightly. As the rotation of the reel R1 continues, however, the winding of the cable C1 on the reel R1 starts. In this case, the other end of the cable C1 is held securely by the cable restraining mechanism 31, so that the cable C1 slides between the reel R1 and the guides G1a and G1b while being wound on the reel R1. When the reel R1 takes up one end side of the cable C1 by a certain amount, the cable C1 starts applying a pressure on the circular side surface of the reel R1. When the length of the cable C1 between the electronic device 200 on one end side of the cable C1 and the opening H1 becomes an adequate length, the predetermined pressure P1th is applied to the pressure sensor S1.

The pressure sensor S1 sends the converting circuit 11 with the signal P1 that indicates the pressure applied to the circular side surface of the reel R1. The converting circuit 11 converts the signal level of the signal P1 and sends the resultant signal to the control circuit 21. Upon reception of the electric signal indicative of the pressure corresponding to the pressure P1th, the control circuit 21 sends the control signal Cr1 to the switch SW1. In response to the control signal Cr1, the switch SW1 stops supplying power to the motor M1 to stop rotating the motor M1 and starts supplying power to the constant torque motor 61. The constant torque motor 61 drives the movable pieces 41a and 41b of the cable restraining mechanism 41 to hold the cable C1 and restrains the further movement of the cable C1 into the casing 10.

The above-described sequence of operations causes the surplus portion of the cable C1 to be retained in the storage section 101. Therefore, the lengths of the cable C1 between the electronic device 200 and the storage section 100 and between the electronic device 300 and the storage section 100 are adjusted to the adequate lengths. The storage sections 102 and 103 have the same capabilities as that of the storage section 101, so that the cable storage apparatus 100 promotes the automation of orderly surplus length processing with respect to diverse cable connections of information devices and AV (Audio and Visual) devices.

It is to be noted that the sizes and strengths of reels R2 and R3, sensors S2 and S3 and two kinds of cable restraining mechanisms 32, 33 and 42, 43, and predetermined pressures to be detected are designed in accordance with the types of cables to be wound around the reels.

Motors M2 and M3, switches SW2 and SW3 and openings E2, E3, H2 and H3 in the storage sections 102 and 103 are likewise designed in accordance with the types of cables to be wound around the reels.

Figure 4:
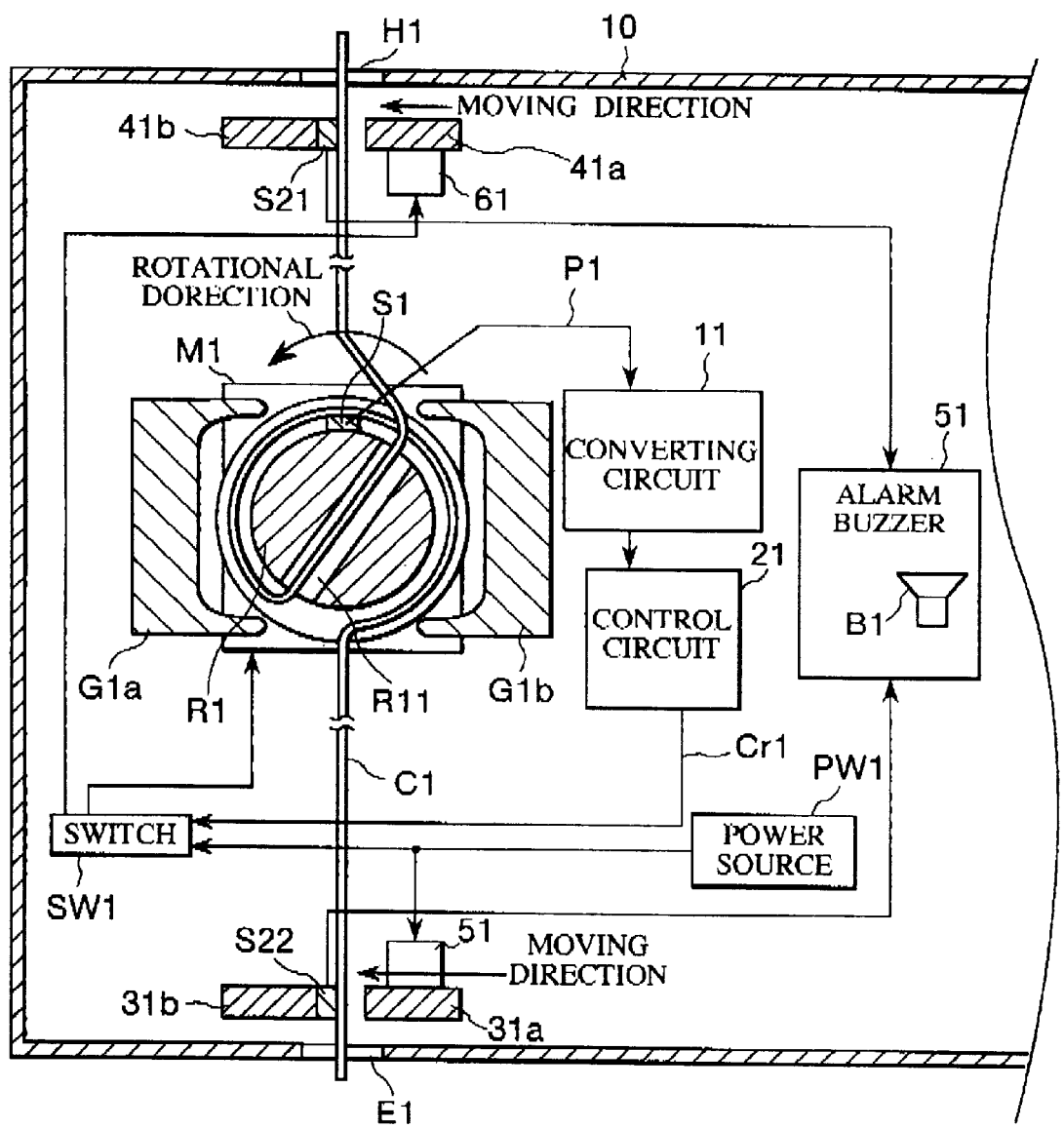
FIG. 4 is a diagram showing the detailed structure of a storage section of a cable storage apparatus according to a second embodiment of the invention.

FIG. 4 presents a structural diagram of a storage section 101A of a cable storage apparatus 100A according to another embodiment of the invention. The cable storage apparatus 100A has a capability of detecting detachment (coming off) of the connectors that are connected to the electronic devices 200 and 300 in FIG. 1 and generating an alarm when such detection is made. The storage section 101A will be discussed below with reference to FIG. 4. Same symbols are given to those components in FIG. 4 which are the same as the corresponding components in FIG. 3.

The movable piece 41b of the cable restraining mechanism 41 in the storage section 101A has a tension sensor S21 provided at its distal end portion which holds the cable C1. The movable piece 31b of the cable restraining mechanism 31 has a tension sensor S22 provided at its distal end portion which holds the cable C1.

The tension sensors S21 and S22 respectively measure tension T1 of that portion of the cable C1 which lies on that side of the electronic device 200 and tension T2 of that portion of the cable C1 which lies on that side of the electronic device 300. When the connector CC1 or CC2 of the cable C1 comes off the connector CT of the electronic device 200 or 300, the tensions T1 and T2 of the cable C1 fall. The output signals of the tension sensors S21 and S22 are sent to an alarm buzzer circuit 51. The alarm buzzer circuit 51 discriminates the amount of reduction in tension that is indicated by the signal supplied from the tension sensor S21 or S22 and determines whether or not the reduction amount is equal to or greater than a predetermined reference value T1th. If the reduction amount of tension is equal to or greater than the reference value T1th, a buzzer generates an alarm.

Suppose the connector that is connected to one end of the cable C1 comes off the electronic device 200 in the state shown in FIG. 4. Then, the tension of one end of the cable C1 drops rapidly, so that the tension detected by the tension sensor S22 falls sharply. If the tension drops from T1 to T11, the amount of reduction ΔT becomes T10–T11. The alarm buzzer circuit 51 compares this reduction amount ΔT with the reference value T1th. When the reduction amount ΔT is equal to or greater than the reference value T1th, the alarm buzzer circuit 51 drives the buzzer B1, warning a user of the disconnection of the cable C1.

The invention is not limited to the above-described embodiments, but may be modified and adapted in various other forms.

For example, the structures of the cable restraining mechanisms 31 and 41 are not limited to the above-described structures, and may be so designed that the movable pieces take the form of an elastic member, such as a spring, to press a cable with the force of the elastic member and the pressing is released by an actuator. The cable restraining mechanisms may be so designed as not to use movable pieces. The position where the pressure sensor S1 is attached is not limited to the side surface of the reel R1 but can be set arbitrarily.

The motor for driving the reel may be controlled based on the tension of a cable. For instance, the motor M1 may be driven to wind the cable on the reel until the tension reaches a given value. When the tension drops sharply, an alarm is buzzed.

The number of cables that are processed by the cable storage apparatus is not limited to three, but may be set to any number.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2000-042561 filed on Feb. 21, 2000 and including specification, claims, drawings and summary. The disclosure of the above Japanese Patent Application is incorporated herein by reference in its entirety.

What is claimed is:

1. A cable storage apparatus comprising:
  a casing;
  a cable having both ends respectively to be connected to connectors;
  a reel which is disposed in said casing and around which said cable is to be wound;
  a winding mechanism which winds said cable by rotating said reel;
  a pressure sensor which measures a pressure on said cable; and
  a control circuit which controls winding of said cable by said winding mechanism when said pressure measured by said pressure sensor becomes equal to or higher than a predetermined value.

2. The cable storage apparatus according to claim 1, further comprising:
  a sensor which detects that tension of said cable becomes equal to or lower than a predetermined value; and
  an alarm circuit which generates an alarm in response to detection of said sensor.

3. A cable storage apparatus comprising:
  a casing;
  a cable having both ends respectively to be connected to connectors;
  a reel which is disposed in said casing and around which said cable is to be wound;
  a winding mechanism which winds said cable by rotating said reel;
  a pressure sensor which measures a pressure on said cable; and
  a control circuit which controls winding of said cable by said winding mechanism when said pressure measured by said pressure sensor becomes equal to or higher than a predetermined value,
  wherein said pressure sensor is located on a cable winding surface of said reel and measures a pressure of said cable acting on said cable winding surface.

4. A cable storage apparatus comprising:
  a casing;
  a cable having both ends respectively to be connected to connectors;
  a reel which is disposed in said casing and around which said cable is to be wound;
  a winding mechanism which winds said cable by rotating said reel;
  a pressure sensor which measures a pressure on said cable; and
  a control circuit which controls winding of said cable by said winding mechanism when said pressure measured by said pressure sensor becomes equal to or higher than a predetermined value,
  wherein a first opening and a second opening are formed in said casing and a first and second restraining mechanisms which restrain movement of said cable are provided in said casing near said first and second openings.

5. The cable storage apparatus according to claim 4, wherein a cable through hole is formed in said reel, penetrating a circular side surface of said reel perpendicularly to a rotary shaft of said reel;
  said winding mechanism has a motor whose rotary shaft is coaxial to said rotary shaft of said reel; and
  said cable is led through said first opening of said casing, is put through said cable through hole of said reel, is wound on said circular side surface of said reel and is then led out from said second opening of said casing.

6. The cable storage apparatus according to claim 5, wherein with said cable secured by said first restraining mechanism and not by said second restraining mechanism, said reel is rotated by said motor to wind said cable around said reel; and
  when said pressure sensor detects a predetermined pressure, said motor is stopped and said cable is secured by said second restraining mechanism.

7. A cable storage apparatus comprising:
  a casing having two openings formed for insertion of a cable;
  a reel which is disposed in said casing and around which said cable extending between said two openings is to be wound;
  a winding mechanism which winds said cable by rotating said reel;
  a pressure sensor which measures a pressure on said cable; and
  a control circuit which controls winding of said cable by said winding mechanism when said pressure measured by said pressure sensor becomes equal to or higher than a predetermined value.

8. A cable processing method comprising:
  securing a cable at one of a first and a second opening formed in a casing, wherein said cable is led into said casing through said first opening formed in said casing, put through a hole formed perpendicular to a rotary shaft of a reel, wound on a side surface of said reel and led out from said second opening formed in said casing;
  winding said cable around said reel by rotating said reel; and
  detecting force applied to said cable, and stopping rotating said reel and securing said cable at said opening when said force applied to said cable reaches a predetermined value.

9. The cable processing method according to claim 8, wherein tension on said cable is detected and an alarm is generated when said tension becomes equal to or smaller than a predetermined value.

* * * * *

UNITED STATES PATENT AND TRADEMARK OFFICE
CERTIFICATE OF CORRECTION

PATENT NO. : 6,454,202 B2
DATED : September 24, 2002
INVENTOR(S) : Takeharu Ito

It is certified that error appears in the above-identified patent and that said Letters Patent is hereby corrected as shown below:

<u>Column 3,</u>
Line 51, delete "hole R1" insert -- hole R11 --

Signed and Sealed this

Twenty-first Day of January, 2003

JAMES E. ROGAN
*Director of the United States Patent and Trademark Office*